(12) United States Patent
Kwak et al.

(10) Patent No.: US 11,996,056 B2
(45) Date of Patent: *May 28, 2024

(54) ROUND DISPLAY DEVICE HAVING A DEMULTIPLEXER LOCATED BETWEEN GATE STAGES AND LIGHT EMITTING STAGES

(71) Applicant: Samsung Display Co., Ltd., Yongin-Si (KR)

(72) Inventors: Minchae Kwak, Seoul (KR); Kyeonghwa Kim, Asan-si (KR); Mihae Kim, Asan-si (KR); Kyonghwan Oh, Seoul (KR); Sumi Jang, Asan-si (KR); Seunghan Jo, Seoul (KR); Jae-Ho Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/088,682

(22) Filed: Dec. 26, 2022

(65) Prior Publication Data
US 2023/0126345 A1 Apr. 27, 2023

Related U.S. Application Data

(63) Continuation of application No. 17/354,625, filed on Jun. 22, 2021, now Pat. No. 11,538,420.

(30) Foreign Application Priority Data

Sep. 2, 2020 (KR) .................. 10-2020-0111600

(51) Int. Cl.
*G09G 3/3275* (2016.01)
*H10K 59/121* (2023.01)

(52) U.S. Cl.
CPC ......... *G09G 3/3275* (2013.01); *H10K 59/121* (2023.02); *G09G 2310/0297* (2013.01)

(58) Field of Classification Search
CPC ..................................... G09G 3/3275
(Continued)

(56) References Cited

U.S. PATENT DOCUMENTS 11,538,420 B2 * 12/2022 Kwak .................. G09G 3/3233
2007/0040764 A1 2/2007 Kim
(Continued)

FOREIGN PATENT DOCUMENTS

JP 2019-020705 A 2/2019
KR 10-2016-0108639 A 9/2016
(Continued)

*Primary Examiner* — Long D Pham
(74) *Attorney, Agent, or Firm* — Innovation Counsel LLP

(57) ABSTRACT

A display device may include a substrate including a circular display area and a non-display area, a plurality of pixels including a first pixel and a second pixel disposed on the display area of the substrate, a first sub-demux circuit connected to the first pixel and disposed on the non-display area, a second sub-demux circuit connected to the second pixel and disposed on the non-display area, a first connection line connected to the first sub-demux circuit and the second sub-demux circuit and disposed on the non-display area to transfer first and second data input signals to the first and second sub-demux circuits, and a plurality of gate stages connected to the pixels and disposed on the non-display area to transfer gate signals to the pixels. Some of the gate stages are disposed between the first sub-demux circuit and the second sub-demux circuit.

6 Claims, 11 Drawing Sheets

(58) Field of Classification Search
USPC .......................................................... 345/204
See application file for complete search history.

(56) References Cited

U.S. PATENT DOCUMENTS

| | | |
|---|---|---|
| 2014/0198135 A1 | 7/2014 | Eom et al. |
| 2016/0019842 A1 | 1/2016 | Kim |
| 2016/0093260 A1 | 3/2016 | Watsuda |
| 2016/0232837 A1 | 8/2016 | Lee |
| 2017/0116923 A1 | 4/2017 | Bae et al. |
| 2017/0221434 A1* | 8/2017 | Shima .................. G09G 3/3611 |
| 2018/0144679 A1 | 5/2018 | Lee et al. |
| 2018/0158895 A1 | 6/2018 | Lee et al. |
| 2019/0027090 A1 | 1/2019 | Nonaka et al. |
| 2019/0140036 A1* | 5/2019 | Hyeon .................. H10K 77/111 |

FOREIGN PATENT DOCUMENTS

| | | |
|---|---|---|
| KR | 10-2018-0032739 A | 4/2018 |
| KR | 10-2019-0053314 A | 5/2019 |

* cited by examiner

ROUND DISPLAY DEVICE HAVING A DEMULTIPLEXER LOCATED BETWEEN GATE STAGES AND LIGHT EMITTING STAGES

CROSS-REFERENCE TO RELATED APPLICATION

This application is a continuation application of U.S. patent application Ser. No. 17/354,625 filed on Jun. 22, 2021, which claims priority under 35 USC § 119 to Korean Patent Application No. 10-2020-0111600 filed on Sep. 2, 2020, in the Korean Intellectual Property Office (KIPO), the disclosures of which are incorporated herein in their entirety by reference.

BACKGROUND

1. Field

The present application relates to a display device. More specifically, the present application relates to a display device including a plurality of circuits.

2. Description of the Related Art

Display devices are produced as various types of display devices such as organic light emitting diodes, liquid crystal displays, and quantum-dot nano light emitting diodes.

Research is being conducted to diversify the shape of the display device. For example, research on a display device having a circular display area is being conducted. The display device having a circular display area may be a circular display device or a polygonal, for example, rectangular, display device.

A plurality of circuits, e.g., such as a light emitting circuit and a gate circuit, may be disposed adjacent to a circumference of the circular display area. Accordingly, lines for connecting the circuits and the circular display area may overlap each other. Accordingly, a coupling may occur between the overlapping lines. In addition, since a space is required for placing the lines, a dead space of the display device may increase.

SUMMARY

In accordance with an embodiment, a display device including a plurality of circuits is provided.

In a display device according to embodiments, the display device may include a substrate, a plurality of pixels, a first sub-demux circuit, a second sub-demux circuit, a first connection line, and a plurality of gate stages. The substrate includes a circular display area and a non-display area surrounding the display area. The pixels include a first pixel and a second pixel disposed on the display area of the substrate. The first sub-demux circuit is connected to the first pixel and is disposed on the non-display area to transfer a first data output signal to the first pixel. The second sub-demux circuit is connected to the second pixel and disposed on the non-display area to transfer a second data output signal to the second pixel. The first connection line is connected to the first sub-demux circuit and the second sub-demux circuit and disposed on the non-display area to transfer a first data input signal to the first sub-demux circuit and transfer a second data input signal to the second sub-demux circuit. The gate stages are connected to the pixels and disposed on the non-display area to transfer gate signals to the pixels. Some of the gate stages are disposed between the first sub-demux circuit and the second sub-demux circuit.

In one embodiment, the first pixel may be disposed in a first pixel column, and the second pixel is disposed in a second pixel column.

In one embodiment, the display device may further include a plurality of light emitting stages connected to the pixels and disposed on the non-display area to transfer light emitting signals to the pixels, wherein some of the light emitting stages may be disposed between the first sub-demux circuit and the second sub-demux circuit.

In one embodiment, the first pixel may include first, second, and third sub-pixels, the second pixel includes fourth, fifth, and sixth sub-pixels, and the first connection line may include first, second, and third sub-connection lines.

In one embodiment, the first sub-connection line may be connected to the first sub-pixel and the fourth sub-pixel, and may transfer a data output signal to the first sub-pixel and the fourth sub-pixel. The second sub-connection line may be connected to the second sub-pixel and the fifth sub-pixel, and may transfer the data output signal to the second sub-pixel and the fifth sub-pixel. The third sub-connection line may be connected to the third sub-pixel and the sixth sub-pixel, and may transfer the data output signal to the third sub-pixel and the sixth sub-pixel.

In one embodiment, the first sub-connection line may be connected to a first switching transistor connected to the first sub-pixel and a second switching transistor connected to the fourth sub-pixel. The second sub-connection line may be connected to a third switching transistor connected to the second sub-pixel and a fourth switching transistor connected to the fifth sub-pixel. The third sub-connection line may be connected to a fifth switching transistor connected to the third sub-pixel and a sixth switching transistor connected to the sixth sub-pixel.

In one embodiment, the display device may further include a first transfer line for transferring a first gate-on signal to the first switching transistor, the third switching transistor, and the fifth switching transistor.

In one embodiment, the display device may further include a second transfer line for transferring a second gate-on signal to the second switching transistor, the fourth switching transistor, and the sixth switching transistor.

In one embodiment, the first gate-on signal and the second gate-on signal may be selectively transferred.

In one embodiment, the pixels may further include a third pixel and a fourth pixel disposed on the display area of the substrate. The display device may further include a third sub-demux circuit, a fourth sub-demux circuit, and a second connection line. The third sub-demux circuit is connected to the third pixel and is disposed on the non-display area to transfer a third data output signal to the third pixel. The fourth sub-demux circuit is connected to the fourth pixel and is disposed on the non-display area to transfer a fourth data output signal to the fourth pixel. The second connection line is connected to the third sub-demux circuit and the fourth sub-demux circuit and is disposed on the non-display area to transfer a third data input signal to the third sub-demux circuit and transfer a fourth data input signal to the fourth sub-demux circuit. Another of the gate stages may be disposed between the second sub-demux circuit and the third sub-demux circuit, and still another of the gate stages may be disposed between the third sub-demux circuit and the fourth sub-demux circuit.

In one embodiment, the first pixel may be disposed in a first pixel column, the second pixel may be disposed in a second pixel column, the third pixel may be disposed in a third pixel column, and the fourth pixel may be disposed in a fourth pixel column.

In one embodiment, a distance between the first sub-demux circuit and the second sub-demux circuit connected to the first connection line may be different from a distance between the third sub-demux circuit and the fourth sub-demux circuit connected to the second connection line.

In one embodiment, the display device may further include a plurality of light emitting stages connected to the pixels to transfer light emitting signals to the pixels. Some of the light emitting stages may be disposed between the first sub-demux circuit and the second sub-demux circuit, another of the light emitting stages may be disposed between the second sub-demux circuit and the third sub-demux circuit, and still another of the light emitting stages may be disposed between the third sub-demux circuit and the fourth sub-demux circuit.

In one embodiment, the third pixel may include first, second, and third sub-pixels, the fourth pixel may include fourth, fifth, and sixth sub-pixels, and the second connection lines may include first, second, and third sub-connection lines.

In one embodiment, the first sub-connection line may be connected to the first sub-pixel and the fourth sub-pixel, and may transfer a data output signal to the first sub-pixel and the fourth sub-pixel. The second sub-connection line may be connected to the second sub-pixel and the fifth sub-pixel, and may transfer the data output signal to the second sub-pixel and the fifth sub-pixel. The third sub-connection line may be connected to the third sub-pixel and the sixth sub-pixel, and may transfer the data output signal to the third sub-pixel and the sixth sub-pixel.

In one embodiment, the first sub-connection line may be connected to a first switching transistor connected to the first sub-pixel and a second switching transistor connected to the fourth sub-pixel. The second sub-connection line may be connected to a third switching transistor connected to the second sub-pixel and a fourth switching transistor connected to the fifth sub-pixel. The third sub-connection line may be connected to a fifth switching transistor connected to the third sub-pixel and a sixth switching transistor connected to the sixth sub-pixel.

In one embodiment, the display device may further include a first transfer line for transferring a first gate-on signal to the first switching transistor, the third switching transistor, and the fifth switching transistor.

In one embodiment, the display device may further include a second transfer line for transferring a second gate-on signal to the second switching transistor, the fourth switching transistor, and the sixth switching transistor.

In one embodiment, the first gate-on signal and the second gate-on signal may be selectively transferred.

In a display device according to embodiments, the display device may include a substrate, first to n-th pixels, first to n-th sub-demux circuits, a connection line, and a plurality of gate stages. The substrate includes a circular display area and a non-display area surrounding the display area. The first to n-th pixels are disposed on the display area of the substrate, where, n is a natural number of 3 or more. The first to n-th sub-demux circuits are each connected to the first to n-th pixels and disposed on the non-display area to transfer first to n-th data output signals to the first to n-th pixels, respectively. The connection line is connected to the first to n-th sub-demux circuits and disposed on the non-display area to transfer n-th data input signals to the first to n-th sub-demux circuits, respectively. The gate stages are each connected to the first to n-th pixels and are disposed between the first sub-demux circuit and the n-th sub-demux circuit to transfer gate signals to the first to n-th pixels, respectively.

In one embodiment, the first to n-th pixels may be disposed in first to n-th pixel columns, respectively.

In one embodiment, the display device may further include a plurality of light emitting stages disposed between the first sub-demux circuit and the n-th sub-demux circuit.

In one embodiment, each of the first to n-th pixels may include a plurality of sub-pixels, and the connection line includes first to third sub-connection lines.

The display device according to embodiments may include a plurality of sub-demux circuits. At least two of the sub-demux circuits may be connected to operate as one demux circuit. For example, two sub-demux circuits may operate as one demux circuit. At least one light emitting stage and at least one gate stage may be disposed between the two sub-demux circuits.

When the sub-demux circuits are disposed to be spaced apart from each other, an area overlapping the light emitting lines connected to the light emitting stage and an area overlapping a gate line connected to the gate stage with data lines connecting the sub-demux circuits to a plurality of pixels may be reduced.

In addition, the circuits (or stages) may be disposed adjacent to a plurality of pixels connected to the circuits (or stages), so that a space in which the lines connecting the circuits to the pixels are disposed may be minimized.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Figure 1:
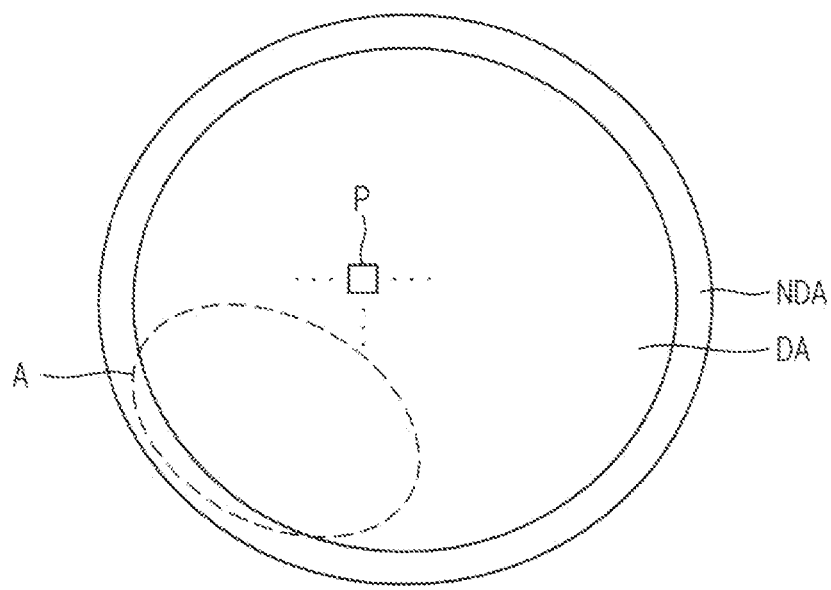
FIGS. 1 and 2 are plan views showing a display device according to embodiments.

Hereinafter, embodiments will be described in more detail with reference to the accompanying drawings. The same reference numerals are used for the same components in the drawings, and redundant descriptions of the same components will be omitted.

Figure 2:
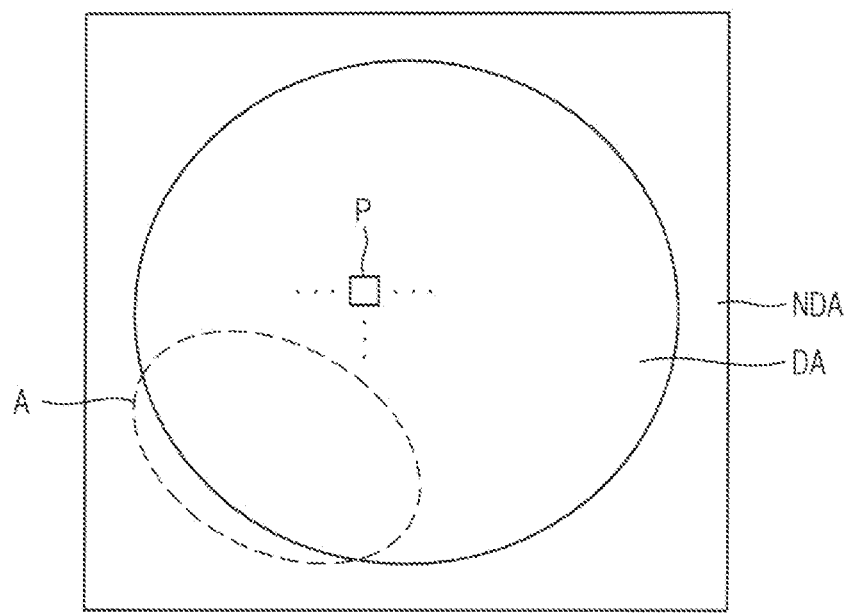

FIGS. 1 and 2 are plan views showing a display device according to embodiments.

Referring to FIGS. 1 and 2, the display device may include a display area DA and a non-display area NDA. The display area DA may have a circular shape. Although FIGS. 1 and 2 show that the display area DA has a circular shape with a predetermined curvature, shapes other than a circular shape with a predetermined curvature are possible. For example, the display area DA may have an oval shape. Alternatively, in the embodiments, the display area DA may have a predetermined curvature at an area in which a first straight portion extending in a first direction meets a second straight portion extending in a second direction perpendicular to the first direction. For example, the display area DA may have a square shape as a whole and each vertex may have a predetermined curvature. A plurality of pixels P may be disposed in the display area DA. For example, the pixels P may be disposed in a matrix shape. The pixels P may be disposed stepwise at an edge of the display area DA. For example, the pixels P may be arranged stepwise at the edge of the display area DA to express the curvature.

The non-display area NDA may surround the display area DA. As shown in FIG. 1, the non-display area NDA may have a circular shape like the display area DA. In other words, the display device may have a circular shape.

In addition, as shown in FIG. 2, the non-display area NDA may have a rectangular shape unlike the display area DA. In other words, the display device may have a rectangular shape and have a circular display area DA. In addition, the display device may have a polygonal shape with a circular display area DA.

A plurality of circuits for driving the display area DA may be disposed in the non-display area NDA. In other words, the circuits may be electrically connected to the pixels P disposed in the display area DA. The circuits may be disposed adjacent to the display area DA. For example, the circuits may be disposed in a circular shape along the circumference of the circular display area DA.

In the embodiments, the circuits may transfer a plurality of signals for driving the pixels P. For example, the circuits may include a data circuit for transferring data signals to the pixels P. In addition, the circuits may include a light emitting circuit for transferring light emitting signals to the pixels P. In addition, the circuits may include a gate circuit for transferring gate signals to the pixels P.

Figure 3A:
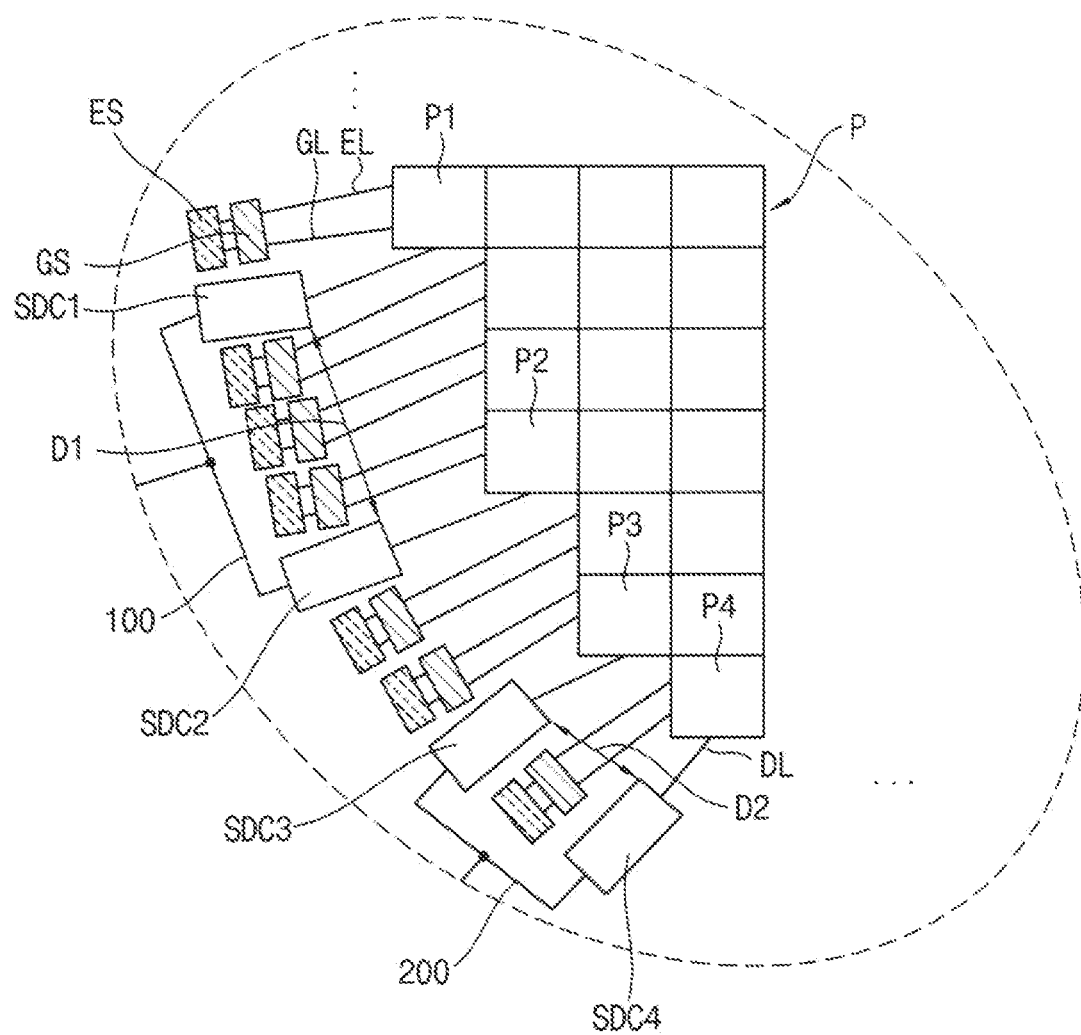
FIG. 3A is a view schematically showing embodiments in which area A of the display device of FIG. 1 is enlarged.
Figure 3B:
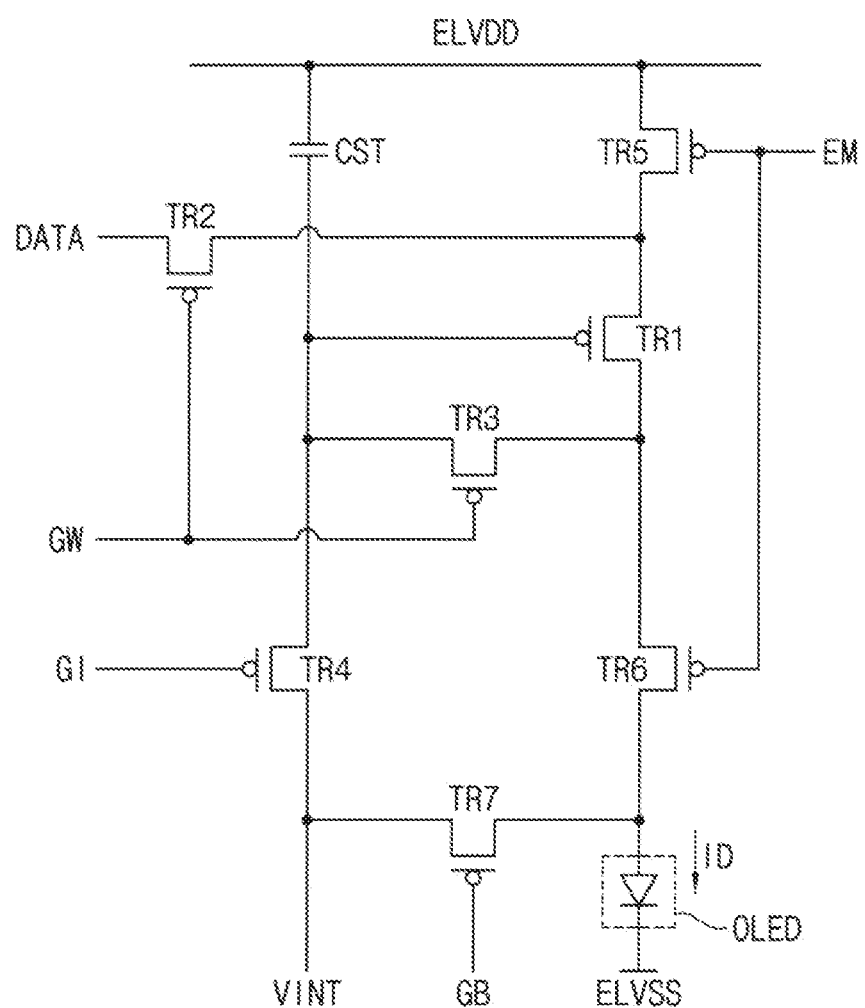
FIG. 3B is a circuit diagram for illustrating a pixel of FIG. 1.

FIG. 3A is a view schematically showing embodiments in which area A of the display device of FIG. 1 is enlarged. FIG. 3B is a circuit diagram for illustrating a pixel P of FIG. 1.

Referring to FIGS. 1, 3A and 3B, the display device may include pixels P. The pixels P may include at least one transistor and at least one capacitor. For example, the pixels P may include first to seventh transistors TR1, TR2, TR3, TR4, TR5, TR6, and TR7, and a storage capacitor CST. The pixels P may include a first pixel P1, a second pixel P2, a third pixel P3, and a fourth pixel P4. The display device may include a first demux circuit DC1 and a second demux circuit DC2 disposed in the non-display area NDA. The first demux circuit DC1 may include a first sub-demux circuit SDC1 and a second sub-demux circuit SDC2. The second demux circuit DC2 may include a third sub-demux circuit SDC3 and a fourth sub-demux circuit SDC4. In the embodiments, the demux circuits DC1 and DC2 may transfer a data signal DATA to the pixels P.

The first pixel P1 may be disposed in a first pixel column. The first pixel P1 disposed in the first pixel column may be connected to the first sub-demux circuit SDC1. The second pixel P2 may be disposed in a second pixel column. The second pixel P2 disposed in the second pixel column may be connected to the second sub-demux circuit SDC2. The third pixel P3 may be disposed in a third pixel column. The third pixel P3 disposed in the third pixel column may be connected to the third sub-demux circuit SDC3. The fourth pixel P4 may be disposed in a fourth pixel column. The fourth pixel P4 disposed in the fourth pixel column may be connected to the fourth sub-demux circuit SDC4.

Figure 4:
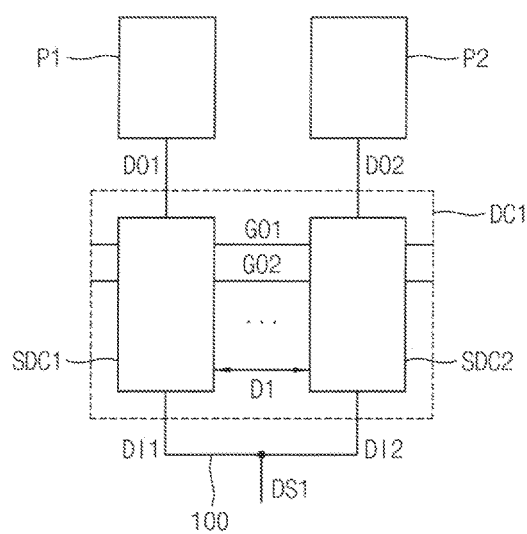
FIG. 4 is a block diagram schematically showing a connection relationship of a first demux circuit disposed in the display device of FIG. 1 according to the embodiments.

In the embodiments, the first sub-demux circuit SDC1 may provide a first data output signal, for example, first data output signal DO1 of FIG. 4, to the pixels P disposed in the first pixel column. The second sub-demux circuit SDC2 may provide a second data output signal, for example, second data output signal DO2 of FIG. 4, to the pixels P disposed in the second pixel column.

The display device may include a gate circuit and a light emitting circuit. In the embodiments, the gate circuit may include a plurality of gate stages GS. The light emitting circuit may include a plurality of light emitting stages ES. The gate stages GS and the light emitting stages ES may be disposed along a periphery of the display area DA.

A plurality of circuits may be disposed between the first sub-demux circuit SDC1 and the second sub-demux circuit SDC2. In the embodiments, at least one gate stage GS may be disposed between the first sub-demux circuit SDC1 and the second sub-demux circuit SDC2.

The gate stage GS may provide a gate signal to the pixels P. The gate stage GS may be connected to the pixels P by a gate line GL. The gate stage GS may transfer a plurality of gate signals GW, GI, and GB to the pixels P.

In addition, in the embodiments, at least one light emitting stage ES may be disposed between the first sub-demux circuit SDC1 and the second sub-demux circuit SDC2. The light emitting stage ES may provide a light emitting signal to the pixels P. The light emitting stage ES may be connected to the pixels P by a light emitting line EL. The light emitting stage ES may transfer a light emitting signal EM to the pixels P.

Accordingly, the pixels P may display an image on the display area DA in response to the data output signal, the light emitting signal, and the gate signal.

The first sub-demux circuit SDC1 and the second sub-demux circuit SDC2 may be disposed to be spaced apart from each other. In addition, the third sub-demux circuit SDC3 and the fourth sub-demux circuit SDC4 may also be disposed to be spaced apart from each other. A first distance D1 in which the first sub-demux circuit SDC1 is spaced apart from the second sub-demux circuit SDC2 may be different from a second distance D2 in which the third sub-demux circuit SDC3 is spaced apart from the fourth sub-demux circuit SDC4. The first distance D1 and the second distance D2 may signify a minimum distance between adjacent sub-demux circuits. For example, as shown in FIG. 3A, the first distance D1 may be determined by stages, e.g., such as the gate stage GS, the light emitting stage ES, disposed between the first sub-demux circuit SDC1 and the second sub-demux circuit SDC2. In addition, the second distance D2 may be determined by stages, e.g., such as the gate stage GS, the light emitting stage ES, disposed between the third sub-demux circuit SDC3 and the fourth sub-demux circuit SDC4.

Although FIG. 3A shows that the curvature of the display area DA is constant, the curvature of the display area DA may not be constant. For example, the display area DA may have an oval shape. Alternatively, as described above in FIG. 1, the display area DA may have a predetermined curvature in an area where the first and second straight portions meet each other. The gate stage GS and the light emitting stage ES may be disposed in different numbers according to the curvature of the display area DA. More pixels P may be disposed in a pixel column located at a portion having a large curvature among the circumference of the oval display area DA compared to a pixel column located at a portion having a small curvature. Accordingly, a relatively large number of the gate stages GS and the light emitting stages ES may be disposed in the area adjacent to the pixel column positioned at the portion having the large curvature. A relatively small number of the gate stages GS and the light emitting stages ES may be disposed in the area adjacent to the pixel column positioned at the portion having the small curvature.

In other words, the number of the stages, e.g., such as the gate stage GS and the light emitting stage ES, disposed between the first sub-demux circuit SDC1 and the second sub-demux circuit SDC2 may vary according to the curvature of the circumference of the display area DA. Accordingly, the first distance D1 may also vary. Likewise, the number of the circuits disposed between the third sub-demux circuit SDC3 and the fourth sub-demux circuit SDC4 may vary according to the curvature of the circumference of the display area DA. Accordingly, the second distance D2 may also vary.

The first sub-demux circuit SDC1 and the second sub-demux circuit SDC2 may be connected by a first connection line 100. Each of the first sub-demux circuit SDC1 and the second sub-demux circuit SDC2 may receive a data signal through the first connection line 100.

The third sub-demux circuit SDC3 and the fourth sub-demux circuit SDC4 may be connected by a second connection line 200. Each of the third sub-demux circuit SDC3 and the fourth sub-demux circuit SDC4 may receive a data signal through the second connection line 200.

FIG. 4 is a block diagram schematically showing a connection relationship of a first demux circuit DC1 disposed in the display device of FIG. 1 according to the embodiments.

Referring to FIGS. 3A and 4, the first pixel P1 may be connected to the first sub-demux circuit SDC1. The second pixel P2 may be connected to the second sub-demux circuit SDC2. The first sub-demux circuit SDC1 and the second sub-demux circuit SDC2 may be connected by the first connection line 100.

The first connection line 100 may be connected to a data driver (not shown). The first connection line 100 may receive a first data signal DS1 from the data driver. In the embodiments, the first connection line 100 may transfer a first data input signal DI1 as the first data signal DS1 to the first sub-demux circuit SDC1. In addition, the first connection line 100 may transfer a second data input signal DI2 as the first data signal DS1 to the second sub-demux circuit SDC2.

In the embodiments, each of the first sub-demux circuit SDC1 and the second sub-demux circuit SDC2 may selectively transfer a data output signal to the first pixel P1 and the second pixel P2, based on a gate-on signal. For example, when a first gate-on signal GO1 for turning on the first sub-demux circuit SDC1 is transferred to the first sub-demux circuit SDC1, the first sub-demux circuit SDC1 may transfer a first data output signal DO1 as the first data signal DS1 to the first pixel P1. At this point, a second gate-on signal GO2 for turning on the second sub-demux circuit SDC2 may not be transferred to the second sub-demux circuit SDC2.

In addition, for example, when the second gate-on signal GO2 is transferred to the second sub-demux circuit SDC2, the second sub-demux circuit SDC2 may transfer a second data output signal DO2 as the first data signal DS1 to the second pixel P2. At this point, the first gate-on signal GO1 may not be transferred to the first sub-demux circuit SDC1.

A plurality of circuits may be disposed between the first sub-demux circuit SDC1 and the second sub-demux circuit SDC2. For example, the light emitting stage ES, the gate stage GS, and the like may be disposed between the first sub-demux circuit SDC1 and the second sub-demux circuit SDC2. At least one light emitting stage ES and at least one gate stage GS may be disposed between the first sub-demux circuit SDC1 and the second sub-demux circuit SDC2. The first distance D1 may be determined according to the disposed number of the light emitting stages ES and the gate stages GS.

Figure 5:
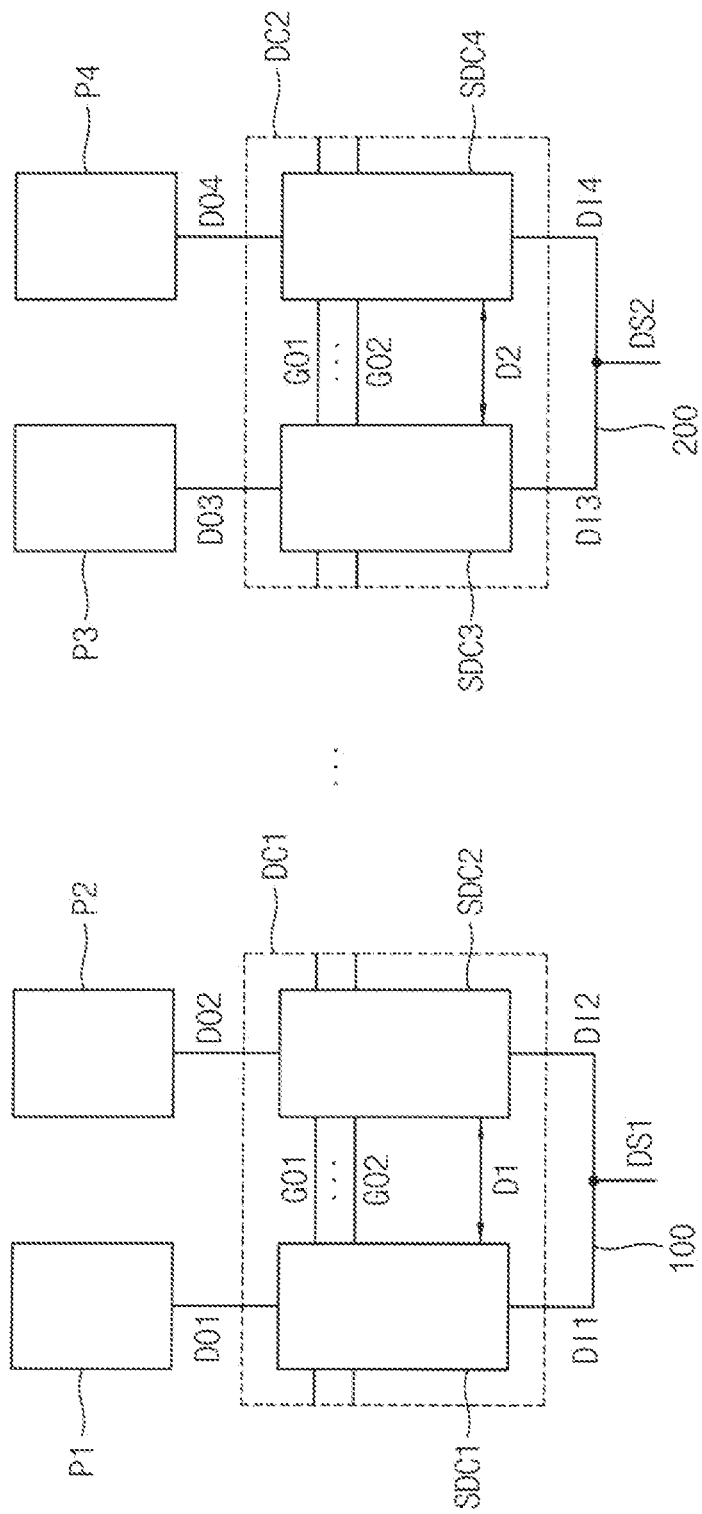
FIG. 5 is a block diagram schematically showing a connection relationship between a first demux circuit and a second demux circuit disposed in the display device of FIG. 1 according to the embodiments.

FIG. 5 is a block diagram schematically showing a connection relationship between a first demux circuit DC1 and a second demux circuit DC2 disposed in the display device DA of FIG. 1 according to the embodiments.

FIG. 5 may be substantially the same as FIG. 4 except that the second demux circuit DC2 is added.

Referring to FIGS. 3 and 5, the third pixel P3 may be connected to the third sub-demux circuit SDC3. The fourth pixel P4 may be connected to the fourth sub-demux circuit SDC4. The third sub-demux circuit SDC3 and the fourth sub-demux circuit SDC4 may be connected by the second connection line 200.

The second connection line 200 may be connected to the data driver. The second connection line 200 may receive a second data signal DS2 from the data driver. In the embodiments, the second connection line 200 may transfer a third data input signal DI3 as the second data signal DS2 to the third sub-demux circuit SDC3. In addition, the second connection line 200 may transfer a fourth data input signal DI4 as the second data signal DS2 to the fourth sub-demux circuit SDC4.

When a first gate-on signal GO1 for turning on the third sub-demux circuit SDC3 is transferred to the third sub-demux circuit SDC3, the third sub-demux circuit SDC3 may transfer a third data output signal DO3 as the second data signal DS2 to the third pixel P3. At this point, a second gate-on signal GO2 for turning on the fourth sub-demux circuit SDC4 may not be transferred to the fourth sub-demux circuit SDC4.

In addition, for example, when the second gate-on signal GO2 is transferred to the fourth sub-demux circuit SDC4, the fourth sub-demux circuit SDC4 may transfer a fourth data output signal DO4 as the second data signal DS2 to the fourth pixel P4. At this point, the first gate-on signal GO1 may not be transferred to the third sub-demux circuit SDC3.

In the embodiments, a plurality of stages may be disposed between the first sub-demux circuit SDC1 and the second sub-demux circuit SDC2, between the second sub-demux circuit SDC2 and the third sub-demux circuit SDC3, and between the third sub-demux circuit SDC3 and the fourth sub-demux circuit SDC4. For example, at least one light emitting stage ES and at least one gate stage GS may be disposed between the first sub-demux circuit SDC1 and the second sub-demux circuit SDC2, between the second sub-demux circuit SDC2 and the third sub-demux circuit SDC3, and between the third sub-demux circuit SDC3 and the fourth sub-demux circuit SDC4. Each of the first distance D1 and the second distance D2 may be determined according to the disposed number of the light emitting stages ES and the gate stages GS. In other words, the first distance D1 and the second distance D2 may be different from each other.

In addition, the disposed number of the light emitting stages ES and the gate stages GS may vary according to the structuring of the pixels P adjacent to the circumference of the display area DA. Thus, the first distance D1 and the second distance D2 may be determined.

Accordingly, when the sub-demux circuits SDC1, SDC2, SDC3, SDC4 are disposed to be spaced apart from each other, lines DL, EL, and GL connected to the pixels P may be connected to the pixels P with a minimized length. Therefore, a dead space of the display device may be reduced.

In addition, when the first sub-demux circuit SDC1 and the second sub-demux circuit SDC2 are not spaced apart and are disposed adjacent to each other, the data line DL connected to each pixel column may have an area overlapping the gate line GL and the light emitting line EL. Accordingly, a coupling phenomenon may occur in the display device. According to the inventive concept, when the sub-demux circuits SDC1, SDC2, SDC3, SDC4 are disposed to be spaced apart from each other, the area in which the data line DL overlaps the gate line GL and the light emitting line EL may be reduced.

Figure 6:
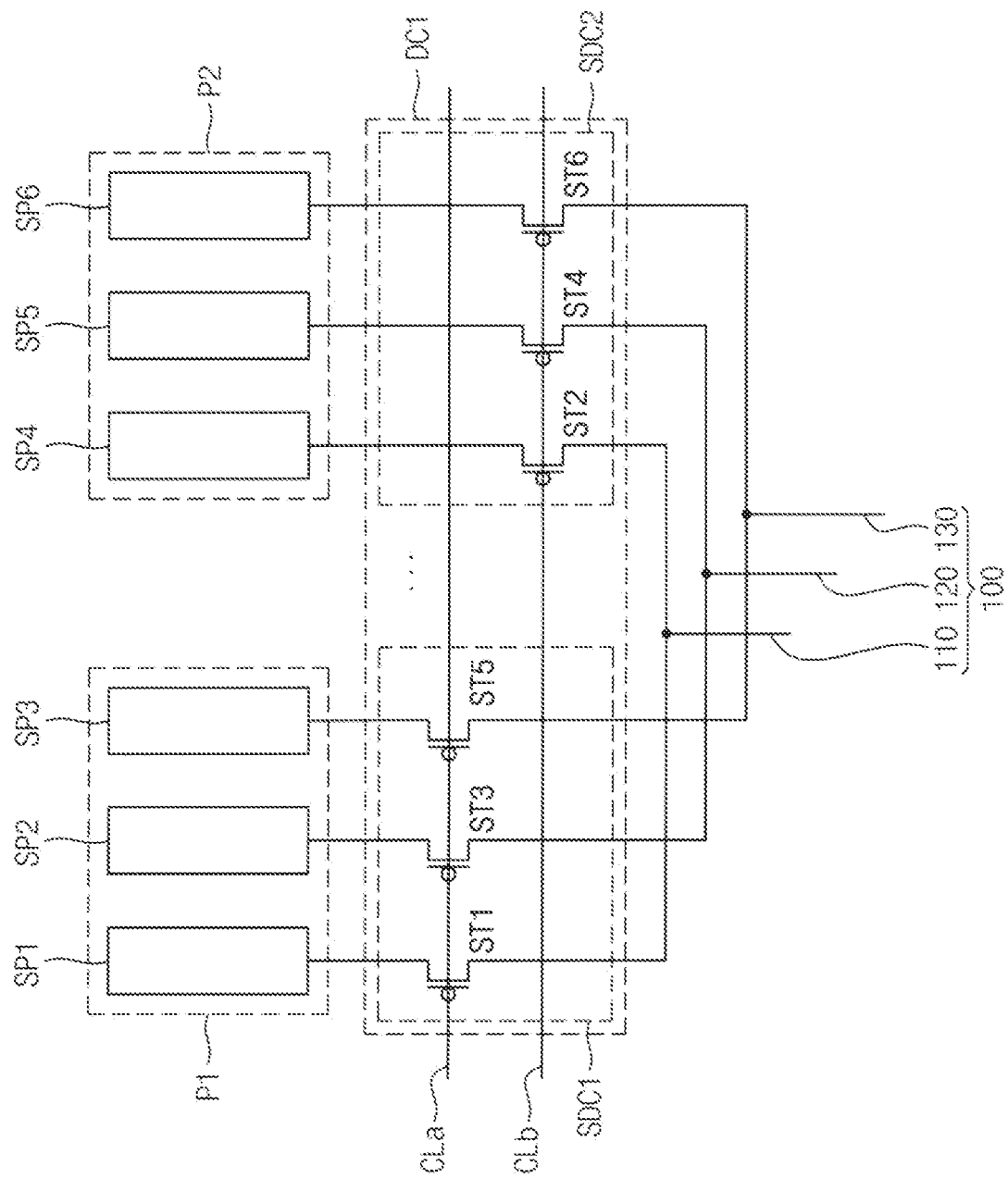
FIG. 6 is a view showing embodiments in which the first demux circuit disposed in the display device of FIG. 1 is enlarged.

FIG. 6 is a view showing embodiments in which the first demux circuit DC1 disposed in the display device of FIG. 1 is enlarged.

Referring to FIGS. 3A and 6, each of the pixels P may include a plurality of sub-pixels. In the embodiments, the first pixel P1 may include first to third sub-pixels SP1, SP2, and SP3. For example, the first sub-pixel SP1 may exhibit a red color, the second sub-pixel SP2 may exhibit a green color, and the third sub-pixel SP3 may exhibit a blue color. However, other colors may be exhibited. For example, the first to third sub-pixels SP1, SP2, and SP3 may exhibit magenta, cyan, and yellow colors, respectively. The first to third sub-pixels SP1, SP2, and SP3 may also emit light with the same color, for example, blue light. The same color of the light may be converted into different colors by a color filter, a color conversion pattern or the like disposed on the first to third sub-pixels SP1, SP2, and SP3. In addition, in the embodiments, the first pixel P1 may include four sub-pixels.

In addition, in the embodiments, the first pixel P1 and the second pixel P2 may include two sub-pixels. The two sub-pixels of the first pixel P1 may emit light with a first color and a second color, respectively. The two sub-pixels of the second pixel P2 may emit light with a first color and a third color, respectively.

In addition, in the embodiments, the first pixel P1 and the second pixel P2 may include two sub-pixels. The two sub-pixels of the first pixel P1 may emit light with a first color and a third color, respectively, and the two sub-pixels of the second pixel P2 may also emit light with the first color and the third color, respectively.

The second pixel P2 may include fourth to sixth sub-pixels SP4, SP5, and SP6. In the embodiments, the second pixel P1 may include fourth to sixth sub-pixels SP4, SP5, and SP6. A structure of the second pixel P2 may be substantially the same as that of the first pixel P1.

The first connection line 100 may include first to third sub-connection lines 110, 120, and 130. The first to third sub-connection lines 110, 120, and 130 may be connected to the first sub-demux circuit SDC1 and the second sub-demux circuit SDC2.

The first sub-connection line 110 may be connected to the first sub-pixel SP1. In addition, the first sub-connection line 110 may be connected to the fourth sub-pixel SP4. Accordingly, the data output signal may be selectively transferred to the first sub-pixel SP1 and the fourth sub-pixel SP4. A red data signal may be selectively transferred to the first sub-pixel SP1 and the fourth sub-pixel SP4. For example, when a first switching transistor ST1 is turned on, a first red data signal may be transferred to the first sub-pixel SP1. Alternatively, when a second switching transistor ST2 is turned on, a second red data signal may be transferred to the fourth sub-pixel SP4. In the embodiments, the first sub-pixel SP1 and the fourth sub-pixel SP4 may be selectively turned on.

The second sub-connection line 120 may be connected to the second sub-pixel SP2. In addition, the second sub-connection line 120 may be connected to a fifth sub-pixel SP5. Accordingly, the data output signal may be selectively transferred to the second sub-pixel SP2 and the fifth sub-pixel SP5. A green data signal may be selectively transferred to the second sub-pixel SP2 and the fifth sub-pixel SP5. For example, when a third switching transistor ST3 is turned on, a first green data signal may be transferred to the second sub-pixel SP2. Alternatively, when a fourth switching transistor ST4 is turned on, a second green data signal may be transferred to the fifth sub-pixel SP5. In the embodiments, the second sub-pixel SP2 and the fifth sub-pixel SP5 may be selectively turned on.

The third sub-connection line 130 may be connected to the third sub-pixel SP3. In addition, the third sub-connection line 130 may be connected to a sixth sub-pixel SP6. Accordingly, the data output signal may be selectively transferred to the third sub-pixel SP3 and the sixth sub-pixel SP6. A blue data signal may be transferred to the third sub-pixel SP3 and the sixth sub-pixel SP6. For example, when a fifth switching transistor ST5 is turned on, a first blue data signal may be transferred to the third sub-pixel SP3. Alternatively, when a sixth switching transistor ST6 is turned on, a second blue data signal may be transferred to the sixth sub-pixel SP6. In the embodiments, the third sub-pixel SP3 and the sixth sub-pixel SP6 may be selectively turned on.

Although the connection line is illustrated as including three connection lines, more or less than three connection lines are included in the connection line in an embodiment. When the number of sub-pixels is changed, the number of connection lines may also be changed. For example, when each of the pixels includes four sub-pixels, the connection line may also include four connection lines.

The first sub-demux circuit SDC1 may include the first switching transistor ST1, the third switching transistor ST3, and the fifth switching transistor ST5. The second sub-demux circuit SDC2 may include the second switching transistor ST2, the fourth switching transistor ST4, and the sixth switching transistor ST6.

The first sub-connection line 110 may be connected to the first switching transistor ST1 and the second switching transistor ST2. The second sub-connection line 120 may be connected to the third switching transistor ST3 and the fourth switching transistor ST4. The third sub-connection line 130 may be connected to the fifth switching transistor ST5 and the sixth switching transistor ST6.

The first switching transistor ST1, the third switching transistor ST3, and the fifth switching transistor ST5 may be electrically connected to a first transfer line CLa. The first transfer line CLa may transfer the first gate-on signal GO1 to the first sub-demux circuit SDC1. For example, the first transfer line CLa may transfer the first gate-on signal GO1 to the first switching transistor ST1, the third switching transistor ST3, and the fifth switching transistor ST5. Data output signals may be transferred to the first pixel P1 through the first switching transistor ST1, the third switching transistor ST3, and the fifth switching transistor ST5.

The second switching transistor ST2, the fourth switching transistor ST4, and the sixth switching transistor ST6 may be connected to a second transfer line CLb. The second transfer line CLb may transfer the second gate-on signal GO2 to the second sub-demux circuit SDC2. For example, the second transfer line CLb may transfer the second gate-on signal GO2 to the second switching transistor ST2, the fourth switching transistor ST4, and the sixth switching transistor ST6. Data output signals may be transferred to the second pixel P2 through the second switching transistor ST2, the fourth switching transistor ST4, and the sixth switching transistor ST6.

A plurality of stages, e.g., such as the gate stage GS and the light emitting stage ES, may be disposed between the first sub-demux circuit SDC1 and the second sub-demux circuit SDC2.

Figure 7:
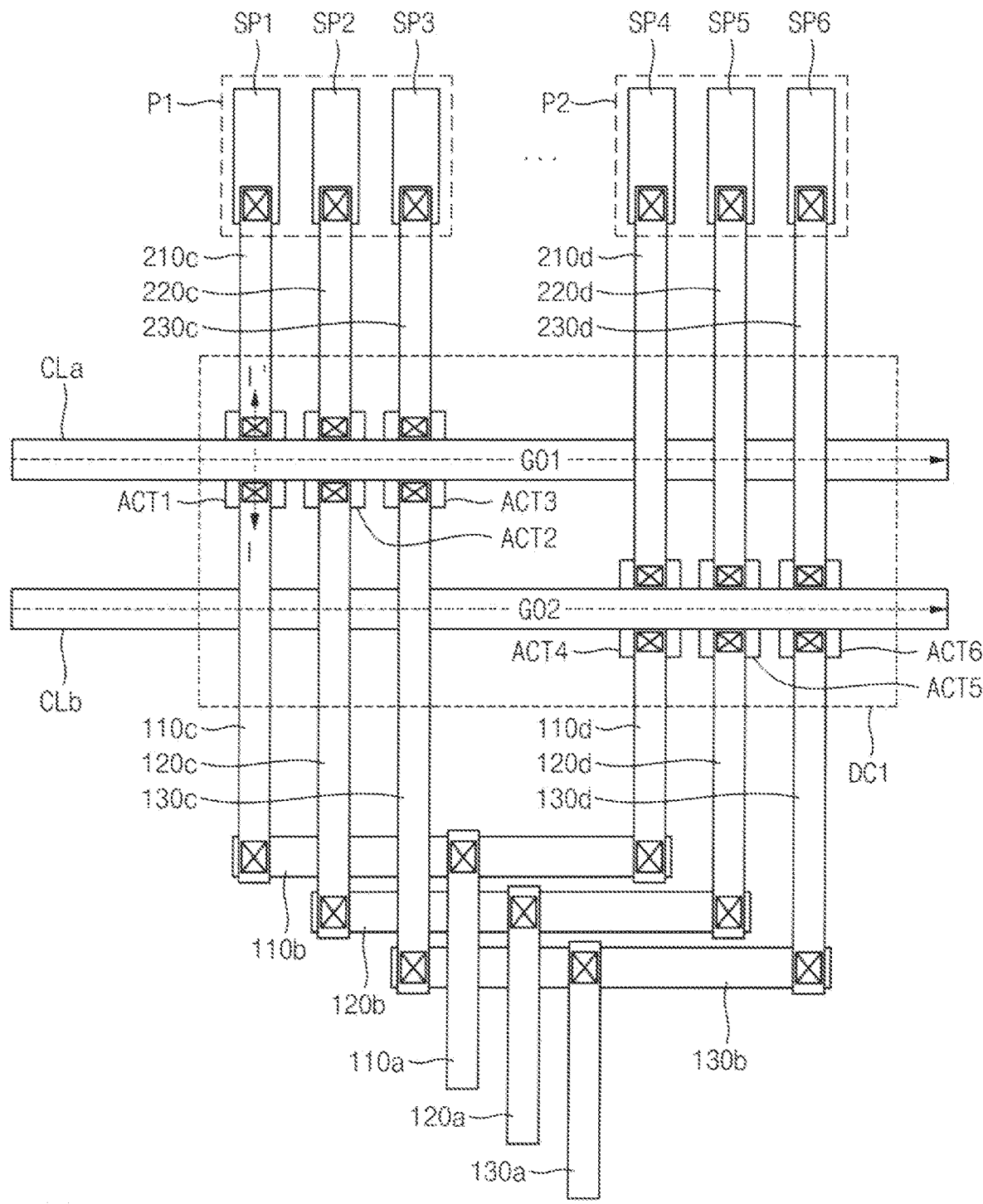
FIG. 7 is a view showing embodiments of first to third sub-connection lines included in the display device of FIG. 1.

FIG. 7 is a view showing embodiments of first to third sub-connection lines 110, 120, 130 included in the display device of FIG. 1.

Referring to FIG. 7, the first connection line 100 may include the first sub-connection line 110, the second sub-connection line 120, and the third sub-connection line 130.

The first sub-connection line 110 may include a first data input line 110$a$, a first data distribution line 110$b$, a first data transfer line 110$c$, and a second data transfer line 110$d$. The second sub-connection line 120 may include a second data input line 120$a$, a second data distribution line 120$b$, a third data transfer line 120$c$, and a fourth data transfer line 120$d$. The third sub-connection line 130 may include a third data input line 130$a$, a third data distribution line 130$b$, a fifth data transfer line 130$c$, and a sixth data transfer line 130$d$.

The first data distribution line 110$b$ may be disposed on the first data input line 110$a$. The first data input line 110$a$ and the first data distribution line 110$b$ may be connected to each other by a contact hole. The first data distribution line 110$b$ may be disposed on the first data transfer line 110$c$ and the second data transfer line 110$d$. The first data distribution line 110$b$ may be connected to the first data transfer line 110$c$ and the second data transfer line 110$d$ through contact holes. A signal flowing through the first data transfer line 110$c$ may be transferred to the first sub-pixel SP1 through a first active layer ACT1 and a first data output line 210$c$. A signal flowing through the second data transfer line 110$d$ may be transferred to the fourth sub-pixel SP4 through a fourth active layer ACT4 and a second data output line 210$d$. Accordingly, the data output signal may be transferred to the first sub-pixel SP1 and the fourth sub-pixel SP4. A red data signal may be selectively transferred to the first sub-pixel SP1 and the fourth sub-pixel SP4.

The second data distribution line 120$b$ may be disposed on the second data input line 120$a$. The second data input line 120$a$ and the second data distribution line 120$b$ may be connected to each other through a contact hole. The second data distribution line 120$b$ may be disposed on a third data transfer line 120$c$ and a fourth data transfer line 120$d$. The second data distribution line 120$b$ may be connected to the third data transfer line 120$c$ and the fourth data transfer line 120$d$ through contact holes. A signal flowing through the third data transfer line 120$c$ may be transferred to the second sub-pixel SP2 through a second active layer ACT2 and a third data output line 220$c$. A signal flowing through the fourth data transfer line 120$d$ may be transferred to the fifth sub-pixel SP5 through a fifth active layer ACT5 and a fourth data output line 220$d$. Accordingly, the data output signal may be transferred to the second sub-pixel SP2 and the fifth sub-pixel SP5. For example, a blue data signal may be selectively transferred to the second sub-pixel SP2 and the fifth sub-pixel SP5.

The third data distribution line 130$b$ may be disposed on the third data input line 130$a$. The third data input line 130$a$ and the third data distribution line 130$b$ may be connected to each other through a contact hole. The third data distribution line 130$b$ may be disposed on a fifth data transfer line 130$c$ and a sixth data transfer line 130$d$. The third data distribution line 130$b$ may be connected to the fifth data transfer line 130$c$ and the sixth data transfer line 130$d$ through contact holes. A signal flowing through the fifth data transfer line 130$c$ may be transferred to the third sub-pixel SP3 through a third active layer ACT3 and a fifth data output line 230$c$. A signal flowing through the sixth data transfer line 130$d$ may be transferred to the sixth sub-pixel SP6 through a sixth active layer ACT6 and a sixth data output line 230$d$. Accordingly, the data output signal may be transferred to the third sub-pixel SP3 and the sixth sub-pixel SP6. For example, a blue data signal may be selectively transferred to the third sub-pixel SP3 and the sixth sub-pixel SP6.

Each of the first active layer ACT1, the second active layer ACT2, and the third active layer ACT3 may serve as a channel for transferring data output signals to the first to third sub-pixels SP1, SP2, and SP3 in response to the first gate-on signal GO1 flowing through the first transfer line CLa.

Each of the fourth active layer ACT4, the fifth active layer ACT5, and the sixth active layer ACT6 may serve as a channel for transferring data output signals to the fourth to sixth sub-pixels SP4, SP5, and SP6 in response to the second gate-on signal GO2 flowing through the second transfer line CLb.

Although FIG. 7 shows that the first to third data distribution lines 110$b$, 120$b$, and 130$b$ are disposed under the first to third data input lines 110$a$, 120$a$, 130$a$ and the first to sixth data transfer lines 110$c$, 110$d$, 120$c$, 120$d$, 130$c$, 130$d$, other structuring is possible in an embodiment. For example, the first to third data input lines 110$a$, 120$a$, and 130$a$ may be disposed under the first to third data distribution lines 110$b$, 120$b$, and 130$b$. Alternatively, for example, the first to sixth data transfer lines 110$c$, 110$d$, 120$c$, 120$d$, 130$c$, and 130$d$ may be disposed under the first to third data distribution lines 110$b$, 120$b$, and 130$b$.

Figure 8:
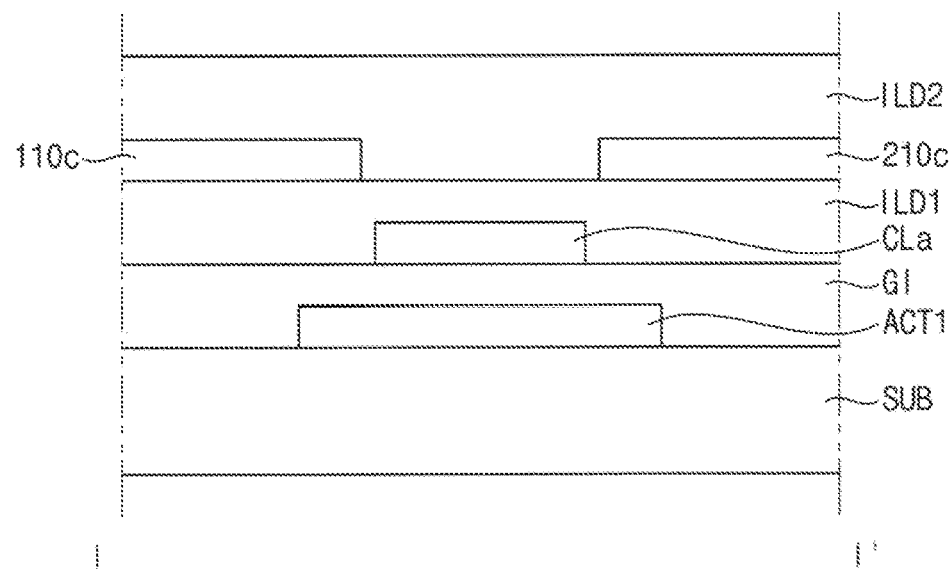
FIG. 8 is a sectional view showing a section taken along line I-I' of FIG. 7.

FIG. 8 is a sectional view showing a section taken along line I-I' of FIG. 7.

Referring to FIGS. 6 to 8, the display device may include a substrate SUB, a gate insulating layer GI, a first interlayer insulating layer ILD1, a second interlayer insulating layer ILD2, and the first switching transistor ST1. The first switching transistor ST1 may include the active layer ACT1, the first transfer line CLa, the first data transfer line 110$c$, and the first data output line 210$c$.

In the embodiments, the substrate SUB may contain plastic, and may have flexible characteristics. Alternatively, in the embodiments, the substrate SUB may include glass, quartz, and the like, and may have rigid characteristics.

The first active layer ACT1 may be disposed on the substrate SUB. The first active layer ACT1 may include a semiconductor material. In the embodiments, the first active layer ACT 1 may include an oxide-based semiconductor material. Alternatively, in the embodiments, the first active layer ACT1 may include a silicon-based semiconductor material.

The gate insulating layer GI may be disposed on the substrate SUB while covering the first active layer ACT1. The gate insulating layer GI may include an inorganic insulating material. For example, the gate insulating layer GI may include silicon oxide, silicon nitride, silicon oxynitride, and the like.

The first transfer line CLa may be disposed on the gate insulating layer GI. The first transfer line CLa may include various conductive materials including metal. For example, the first transfer line CLa may include copper, tungsten, titanium, and the like.

The first interlayer insulating layer ILD1 may be disposed on the gate insulating layer GI while covering the first transfer line CLa. The first interlayer insulating layer ILD1 may include an inorganic insulating material. For example, the first interlayer insulating layer ILD1 may include silicon oxide, silicon nitride, silicon oxynitride, and the like.

The first data transfer line 110c and the first data output line 210c may be disposed on the first interlayer insulating layer ILD1. The first data transfer line 110c and the first data output line 210c may include various conductive materials including metal.

The second interlayer insulating layer ILD2 may be disposed on the first interlayer insulating layer ILD1 while covering the first data transfer line 110c and the first data output line 210c. The second interlayer insulating layer ILD2 may include an organic insulating material. For example, the second interlayer insulating layer ILD2 may include polyimide.

Figure 9:
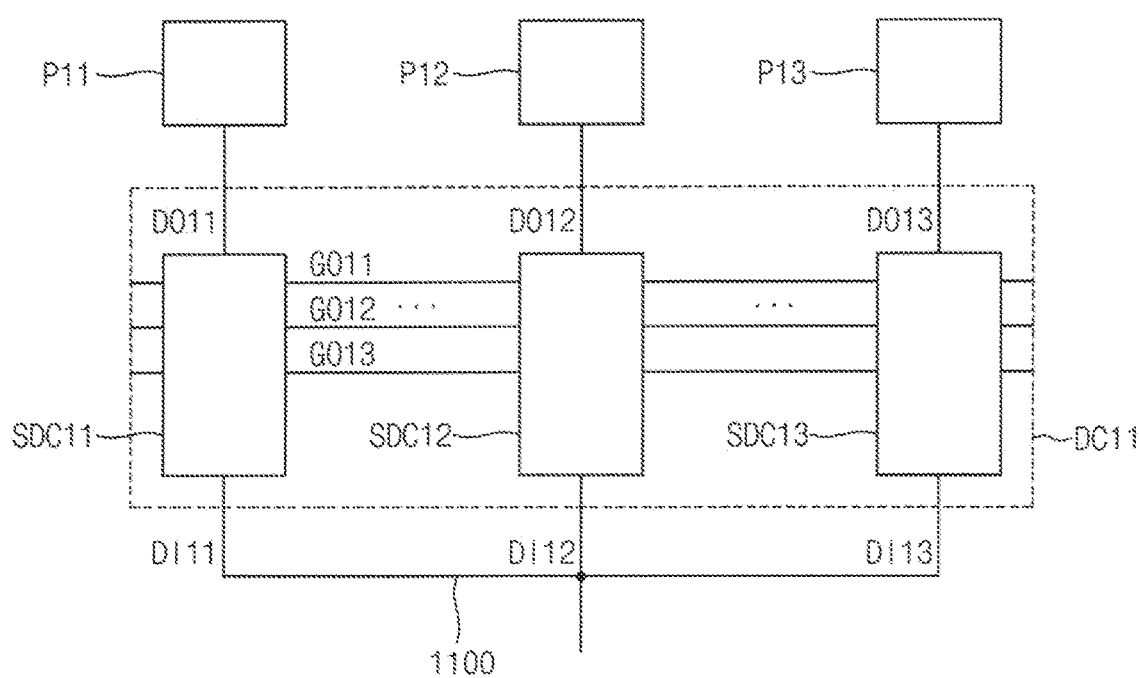
FIG. 9 is a block diagram schematically showing a connection relationship of a demux circuit disposed in the display device of FIG. 1 according to the embodiments.

FIG. 9 is a block diagram schematically showing a connection relationship of a demux circuit DC11 disposed in the display device of FIG. 1 according to the embodiments.

Referring to FIG. 9, the display device may include a first pixel P11, a second pixel P12, a third pixel P13, the first demux circuit DC11, and a first connection line 1100. The first demux circuit DC11 may include a first sub-demux circuit SDC11, a second sub-demux circuit SDC12, and a third sub-demux circuit SDC13.

In the embodiments, the first pixel P11 may be connected to the first sub-demux circuit SDC11. The first sub-demux circuit SDC11 may receive a first data input signal DI11 from the first connection line 1100. The first sub-demux circuit SDC11 may transfer a first data output signal DO11 to the first pixel P11.

In the embodiments, the second pixel P12 may be connected to the second sub-demux circuit SDC12. The second sub-demux circuit SDC12 may receive a second data input signal DI12 from the first connection line 1100. The second sub-demux circuit SDC12 may transfer a second data output signal DO12 to the second pixel P12.

In the embodiments, the third pixel P13 may be connected to the third sub-demux circuit SDC13. The third sub-demux circuit SDC13 may receive a third data input signal D13 from the first connection line 1100. The third sub-demux circuit SDC13 may transfer a third data output signal DO13 to the third pixel P13.

In the embodiments, the first sub-demux circuit SDC11, the second sub-demux circuit SDC12, and the third sub-demux circuit SDC13 may selectively transfer a data output signal. For example, when the first sub-demux circuit SDC11 transfers the first data output signal DO11 to the first pixel P11, the second sub-demux circuit SDC12 and the third sub-demux circuit SDC13 may not transfer the second and third data output signals DO12 and DO13 to the pixels P12 and P13. Alternatively, when the second sub-demux circuit SDC12 transfers the second data output signal DO12 to the second pixel P12, the first sub-demux circuit SDC11 and the third sub-demux circuit SDC13 may not transfer the first and third data outputs signals DO11 and DO13 to the pixels P11 and P13.

The first sub-demux circuit SDC11, the second sub-demux circuit SDC12, and the third sub-demux circuit SDC13 may be a 1:3 demux circuit. A distance spaced between the first sub-demux circuit SDC11 and the third sub-demux circuit SDC13 may be determined according to the number of light emitting stages and the gate stages. However, although FIG. 9 shows that the first connection line 1100 is connected to three sub-demux circuits SDC11, SDC12, SDC13, the first connection line 1100 may also be connected to four or more sub-demux circuits in an embodiment. At least one light emitting stage and at least one gate stage may be disposed between the sub-demux circuits.

Figure 10:
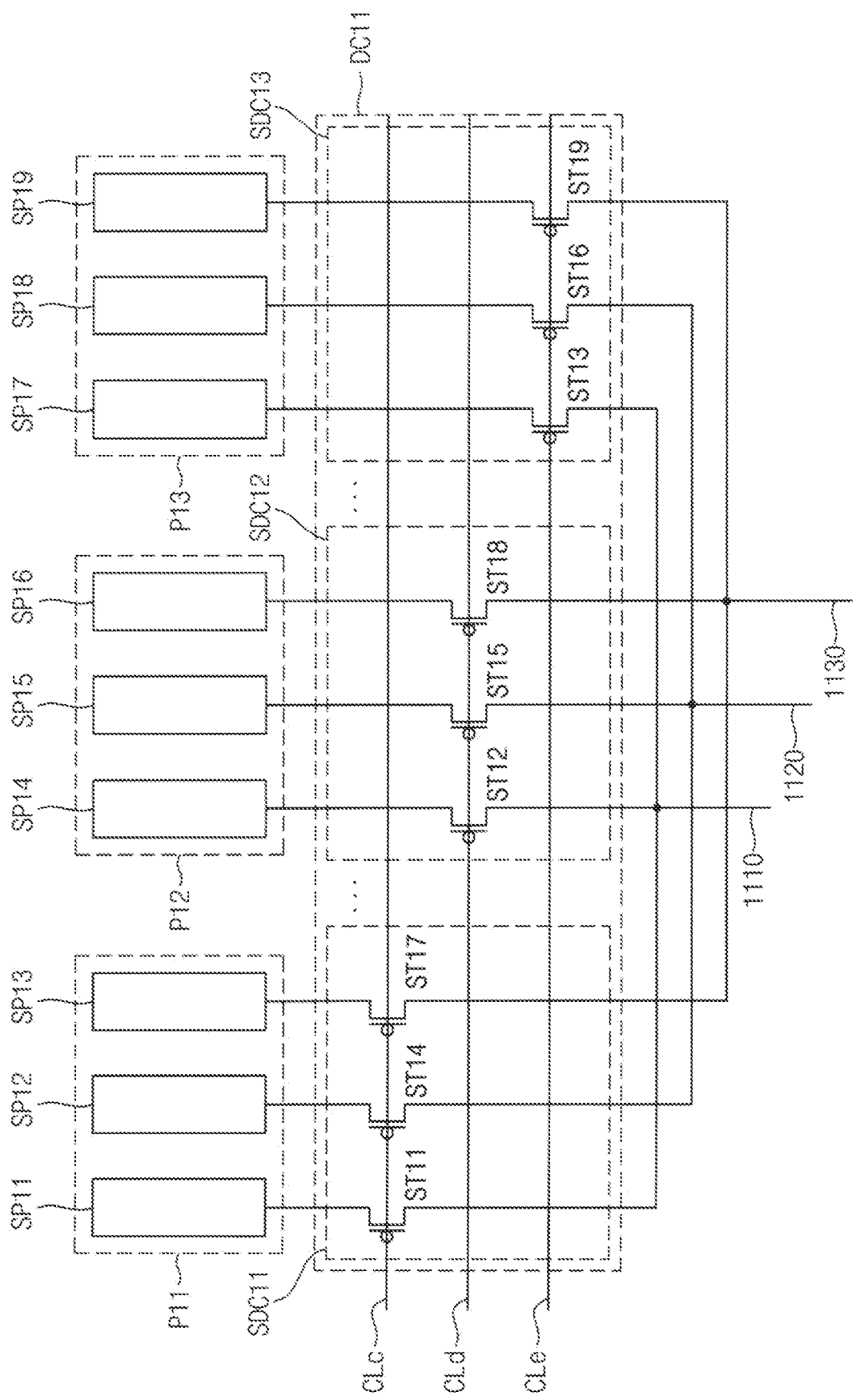
FIG. 10 is a view showing embodiments in which the demux circuit disposed in the display device of FIG. 1 is enlarged.

FIG. 10 is a view showing embodiments in which the demux circuit DC11 disposed in the display device of FIG. 1 is enlarged.

Referring to FIG. 10, the display device may include the first to third pixels P11, P12, and P13. Each of the first to third pixels P11, P12, and P13 may include a plurality of sub-pixels. In the embodiments, the first pixel P11 may include first to third sub-pixels SP11, SP12, and SP13. For example, the first sub-pixel SP11 may exhibit red color, the second sub-pixel SP12 may exhibit green color, and the third sub-pixel SP13 may exhibit blue color. However, the first pixel P11 may include four sub-pixels in an embodiment. In addition, the first to third sub-pixels SP11, SP12, and SP13 may exhibit magenta, cyan, and yellow colors, respectively. The first to third sub-pixels SP11, SP12, and SP13 may emit light with the same color, for example, blue light. The same colors of the light may be differently converted by a color filter, a color conversion pattern or the like disposed on the first to third sub-pixels SP11, SP12, and SP13.

The second pixel P12 may include fourth to sixth sub-pixels SP14, SP15, and SP16. The third pixel P13 may include seventh to ninth sub-pixels SP17, SP18, and SP19. In the embodiments, a structure of the second pixel P12 and a structure of the third pixel P13 may be substantially the same as a structure of the first pixel P11.

The connection line 1100 may include first to third sub-connection lines 1110, 1120, and 1130. The first to third sub-connection lines 1110, 1120, and 1130 may be connected to the first sub-demux circuit SDC11, the second sub-demux circuit SDC12, and the third sub-demux circuit SDC13.

The first sub-connection line 1110 may be connected to the first sub-pixel SP11, the fourth sub-pixel SP14, and the seventh sub-pixel SP17. The data output signal may be transferred to the first sub-pixel SP11, the fourth sub-pixel SP14, and the seventh sub-pixel SP17. A red data signal may be selectively transferred to the first sub-pixel SP11, the fourth sub-pixel SP14, and the seventh sub-pixel SP17. For example, when a first switching transistor ST11 is turned on, a first red data signal may be transferred to the first sub-pixel SP11. Alternatively, when a second switching transistor ST12 is turned on, a second red data signal may be transferred to the fourth sub-pixel SP14. Alternatively, when a third switching transistor ST13 is turned on, a third red data signal may be transferred to the seventh sub-pixel SP17. In the embodiments, the first sub-pixel SP11, the fourth sub-pixel SP14, and the seventh sub-pixel SP17 may be selectively turned on.

The second sub-connection line 1120 may be connected to the second sub-pixel SP12, the fifth sub-pixel SP15, and the eighth sub-pixel SP18. The data output signal may be selectively transferred to the second sub-pixel SP12, the fifth sub-pixel SP15, and the eighth sub-pixel SP18. A green data signal may be selectively transferred to the second sub-pixel SP12, the fifth sub-pixel SP15, and the eighth sub-pixel SP18. For example, when a fourth switching transistor ST14 is turned on, a first green data signal may be transferred to the second sub-pixel SP12. Alternatively, when a fifth switching transistor ST15 is turned on, a second green data signal may be transferred to the fifth sub-pixel SP15. Alternatively, when a sixth switching transistor ST16 is turned on, a third green data signal may be transferred to the eighth sub-pixel SP18. In the embodiments, the second sub-pixel SP12, the fifth sub-pixel SP15, and the eighth sub-pixel SP18 may be selectively turned on.

The third sub-connection line 1130 may be connected to the third sub-pixel SP13, the sixth sub-pixel SP16, and the ninth sub-pixel SP19. The data output signal may be selectively transferred to the third sub-pixel SP13, the sixth sub-pixel SP16, and the ninth sub-pixel SP19. A blue data signal may be selectively transferred to the third sub-pixel SP13, the sixth sub-pixel SP16, and the ninth sub-pixel SP19. For example, when the seventh switching transistor ST17 is turned on, a first blue data signal may be transferred to the third sub-pixel SP13. Alternatively, when the eighth switching transistor ST18 is turned on, a second blue data signal may be transferred to the sixth sub-pixel SP16. Alternatively, when the ninth switching transistor ST19 is turned on, a third blue data signal may be transferred to the ninth sub-pixel SP19. In the embodiments, the third sub-pixel SP13, the sixth sub-pixel SP16, and the ninth sub-pixel SP19 may be selectively turned on.

The first sub-demux circuit SDC11 may include the first switching transistor ST11, the fourth switching transistor ST14, and the seventh switching transistor ST17. The second sub-demux circuit SDC2 may include the second switching transistor ST12, the fifth switching transistor ST15, and the eighth switching transistor ST18. The third sub-demux circuit SDC3 may include the third switching transistor ST13, the sixth switching transistor ST16, and the ninth switching transistor ST19.

The first switching transistor ST11, the fourth switching transistor ST14, and the seventh switching transistor ST17 may be connected to a first transfer line CLc. The first transfer line CLc may transfer a first gate-on signal GO11 to the first sub-demux circuit SDC11. For example, the first transfer line CLc may transfer the first gate-on signal GO11 to the first switching transistor ST11, the fourth switching transistor ST14, and the seventh switching transistor ST17. Accordingly, a first data output signal DO11 may be transferred to the first pixel P11.

The second switching transistor ST12, the fifth switching transistor ST15, and the eighth switching transistor ST18 may be connected to a second transfer line CLd. The second transfer line CLd may transfer a second gate-on signal GO12 to the second sub-demux circuit SDC12. For example, the second transfer line CLd may transfer the second gate-on signal GO12 to the second switching transistor ST12, the fifth switching transistor ST15, and the eighth switching transistor ST18. Accordingly, a second data output signal DO12 may be transferred to the second pixel P12.

The third switching transistor ST13, the sixth switching transistor ST16, and the ninth switching transistor ST19 may be connected to a third transfer line CLe. The third transfer line CLe may transfer a third gate-on signal GO13 to the third sub-demux circuit SDC13. For example, the third transfer line CLe may transfer the third gate-on signal GO13 to the third switching transistor ST13, the sixth switching transistor ST16, and the ninth switching transistor ST19. Accordingly, a third data output signal DO13 may be transferred to the third pixel P13.

Figure 11:
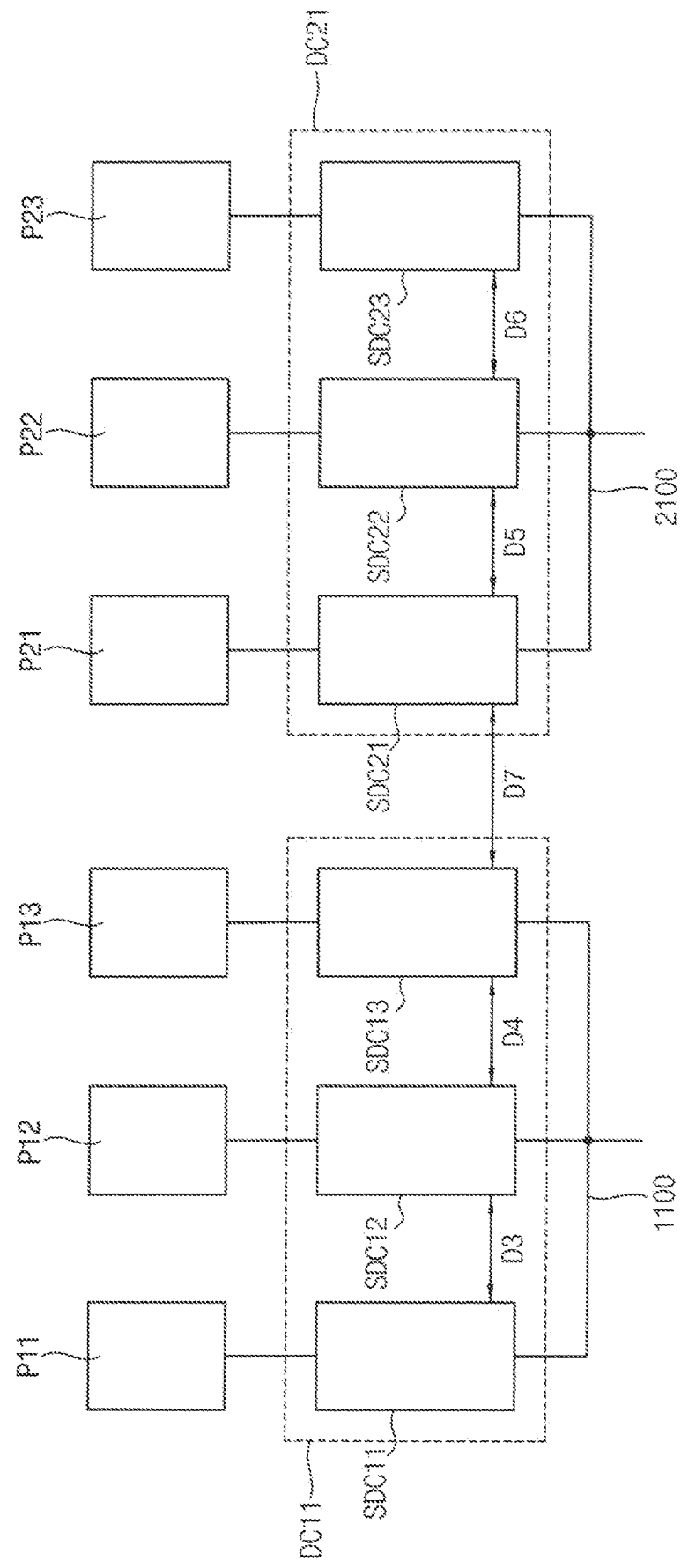
FIG. 11 is a view showing distances between demux circuits and sub-demux circuits.

FIG. 11 is a view showing distances between demux circuits and sub-demux circuits.

Referring to FIGS. 9 and 11, the display device may further include a fourth pixel P21, a fifth pixel P22, a sixth pixel P23, a second demux circuit DC21, and a connection line 2100. The second demux circuit DC21 may include a fourth sub-demux circuit SDC21, a fifth sub-demux circuit SDC22, and a sixth sub-demux circuit SDC23. However, other numbers of sub-demux circuits can be included in the demux circuits DC11 and DC21 in an embodiment. For example, the demux circuits DC11 and DC21 may also include four or more sub-demux circuits.

In the embodiments, the first sub-demux circuit SDC11 and the second sub-demux circuit SDC12 may be spaced apart from each other by a third distance D3. The second sub-demux circuit SDC12 and the third sub-demux circuit SDC13 may be spaced apart from each other by a fourth distance D4. The third distance D3 and the fourth distance D4 may be different from each other. For example, each of the third distance D3 and the fourth distance D4 may be determined according to the number of light emitting stages and gate stages disposed between the sub-demux circuits SDC11, SDC12, and SDC13.

In the embodiments, the fourth sub-demux circuit SDC21 and the fifth sub-demux circuit SDC22 may be spaced apart from each other by a fifth distance D5. The fifth sub-demux circuit SDC22 and the sixth sub-demux circuit SDC23 may be spaced apart from each other by a sixth distance D6. The fifth distance D5 and the sixth distance D6 may be different from each other. For example, each of the fifth distance D5 and the sixth distance D6 may be determined according to the number of light emitting stages and gate stages disposed between the sub-demux circuits SDC21, SDC22, and SDC23.

In addition, adjacent demux circuits DC11 and DC21 may be spaced apart from each other by a seventh distance D7. Accordingly, the third sub-demux circuit SDC13 and the fourth sub-demux circuit SDC21 may be spaced apart from each other by the seventh distance D7.

In the embodiments, at least a part of the third to seventh distances D3, D4, D5, D6, and D7 may be different. In other words, the third to seventh distances D3, D4, D5, D6, and D7 may be determined according to the number of light emitting stages and gate stages disposed between the sub-demux circuits SDC11, SDC12, SDC13, SDC21, SDC22, and SDC23.

Figure 12:
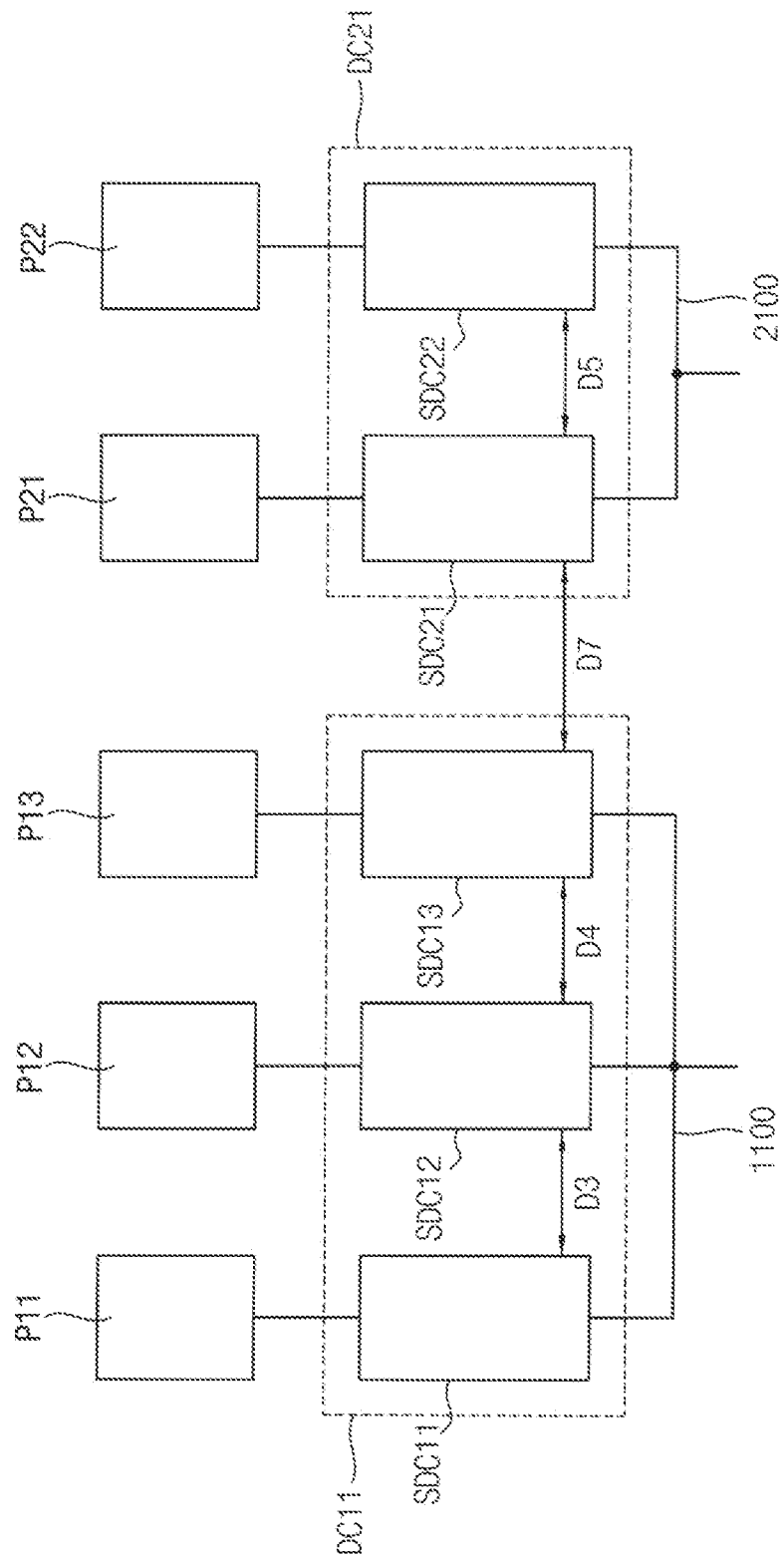
FIG. 12 is a view showing distances between demux circuits and sub-demux circuits.

FIG. 12 is a view showing distances between demux circuits and sub-demux circuits. FIG. 12 may be substantially the same as FIG. 11 except that the second demux circuit DC21 includes two sub-demux circuits SDC21 and SDC22. Accordingly, the description for duplicate components will be omitted.

Referring to FIG. 12, the second demux circuit DC21 of FIG. 12 may include two sub-demux circuits SDC21 and SDC22. Accordingly, the demux circuits DC11 and DC21 may include different numbers of sub-demux circuits. Even in the above case, the third, fourth, fifth, and seventh distances D3, D4, D5, and D7 may be determined according to the number of light emitting stages and gate stages disposed between the sub-demux circuits SDC11, SDC12, SDC13, SDC21, and SDC22.

Although the inventive concept has been described with reference to the embodiments, it will be apparent to a person having ordinary skill in the art that various modifications and variations can be made without departing from the scope and field of the following appended claims.

Embodiments may be applied to a display device or the like. For example, the display device may be applied to smartphones, tablets, laptops, and monitors.

Although it has been described with reference to embodiments, it will be apparent to a person having ordinary skill in the art that various modifications and variations can be made without departing from the scope and field of the following appended claims.

The display device according to the embodiments may be applied to a display device included in a computer, a notebook, a mobile phone, a smartphone, a smart pad, a PMP, a PDA, an MP3 player, or the like.

Although the display devices according to the embodiments have been described with reference to the drawings, the illustrated embodiments are examples, and may be modified and changed by a person having ordinary knowledge in the relevant technical field without departing from the technical spirit described in the following claims.

What is claimed is:

1. A display device comprising:
   a substrate including a circular display area and a non-display area surrounding the display area;
   a plurality of pixels including a first pixel, a second pixel, a third pixel, and a fourth pixel disposed on the display area of the substrate;
   a first sub-demux circuit connected to the first pixel and disposed on the non-display area to transfer a first data output signal to the first pixel;
   a second sub-demux circuit connected to the second pixel and disposed on the non-display area to transfer a second data output signal to the second pixel;
   a third sub-demux circuit connected to the third pixel and disposed on the non-display area to transfer a third data output signal to the third pixel;
   a fourth sub-demux circuit connected to the fourth pixel and disposed on the non-display area to transfer a fourth data output signal to the fourth pixel;
   a first connection line connected to the first sub-demux circuit and the second sub-demux circuit and disposed on the non-display area to transfer a first data input signal to the first sub-demux circuit and transfer a second data input signal to the second sub-demux circuit;
   a second connection line connected to the third sub-demux circuit and the fourth sub-demux circuit and dispose on the non-display area to transfer a third data input signal to the third sub-demux circuit and transfer a fourth data input signal to the fourth sub-demux circuit,
   wherein a distance between the first sub-demux circuit and the second sub-demux circuit connected to the first connection line is different from a distance between the third sub-demux circuit and the fourth sub-demux circuit connected to the second connection line; and
   a plurality of gate stages connected to the pixels and disposed on the non-display area to transfer gate signals to the pixels,
   wherein some of the gate stages are disposed between the first sub-demux circuit and the second sub-demux circuit, and
   wherein another of the gate stages are disposed between the second sub-demux circuit and the third sub-demux circuit, and
   wherein still another of the gate stages are disposed between the third sub-demux circuit and the fourth sub-demux circuit,
   wherein a number of light emitting stages disposed between the first sub-demux circuit and the second sub-demux circuit is different from a number of light emitting stages disposed between the third sub-demux circuit and the fourth sub-demux circuit.

2. The display device of claim 1, wherein the distance between the first sub-demux circuit and the second sub-demux circuit connected to the first connection line is larger than the distance between the third sub-demux circuit and the fourth sub-demux circuit connected to the second connection line.

3. The display device of claim 1, wherein a number of the gate stages disposed between the first sub-demux circuit and the second sub-demux circuit is different from a number of the gate stages disposed between the third sub-demux circuit and the fourth sub-demux circuit.

4. The display device of claim 1, wherein the first pixel is disposed in a first pixel column, and the second pixel is disposed in a second pixel column, and the third pixel is disposed in a third pixel column, and the fourth pixel is disposed in a fourth pixel column.

5. A display device comprising:
   a substrate including a circular display area and a non-display area surrounding the display area;
   a plurality of pixels including a first pixel, a second pixel, a third pixel, and a fourth pixel disposed on the display area of the substrate;
   a first sub-demux circuit connected to the first pixel and disposed on the non-display area to transfer a first data output signal to the first pixel;
   a second sub-demux circuit connected to the second pixel and disposed on the non-display area to transfer a second data output signal to the second pixel;
   a third sub-demux circuit connected to the third pixel and disposed on the non-display area to transfer a third data output signal to the third pixel;
   a fourth sub-demux circuit connected to the fourth pixel and disposed on the non-display area to transfer a fourth data output signal to the fourth pixel;
   a first connection line connected to the first sub-demux circuit and the second sub-demux circuit and disposed on the non-display area to transfer a first data input signal to the first sub-demux circuit and transfer a second data input signal to the second sub-demux circuit;
   a second connection line connected to the third sub-demux circuit and the fourth sub-demux circuit and dispose on the non-display area to transfer a third data input signal to the third sub-demux circuit and transfer a fourth data input signal to the fourth sub-demux circuit,
   wherein a distance between the first sub-demux circuit and the second sub-demux circuit connected to the first connection line is different from a distance between the third sub-demux circuit and the fourth sub-demux circuit connected to the second connection line; and a plurality of light emitting stages connected to the pixels and disposed on the non-display area to transfer light emitting signals to the pixels, wherein some of the light emitting stages are disposed between the first sub-demux circuit and the second sub-demux circuit, and wherein another of the light emitting stages are disposed between the second sub-demux circuit and the third sub-demux circuit, and wherein still another of the light emitting stages are disposed between the third sub-demux circuit and the fourth sub-demux circuit.

6. The display device of claim 5, wherein a number of the light emitting stages disposed between the first sub-demux circuit and the second sub-demux circuit is different from a number of the light emitting stages disposed between the third sub-demux circuit and the fourth sub-demux circuit.

* * * * *